US012733096B2

(12) United States Patent
Hirata et al.

(10) Patent No.: US 12,733,096 B2
(45) Date of Patent: Sep. 8, 2026

(54) FLEXIBLE PRINTED BOARD AND FLEXIBLE PRINTED BOARD CONNECTION STRUCTURE

(71) Applicant: MEKTEC CORPORATION, Tokyo (JP)

(72) Inventors: Masanori Hirata, Tokyo (JP); Garo Miyamoto, Tokyo (JP); Shunsuke Aoyama, Tokyo (JP)

(73) Assignee: MEKTEC CORPORATION, Tokyo (JP)

( * ) Notice: Subject to any disclaimer, the term of this patent is extended or adjusted under 35 U.S.C. 154(b) by 137 days.

(21) Appl. No.: 18/481,201

(22) Filed: Oct. 4, 2023

(65) Prior Publication Data

US 2024/0179840 A1 May 30, 2024

(30) Foreign Application Priority Data

Nov. 29, 2022 (JP) ................................ 2022-190416

(51) Int. Cl.
*H05K 1/11* (2006.01)
*H05K 1/02* (2006.01)
*H05K 1/03* (2006.01)

(52) U.S. Cl.
CPC ........... *H05K 1/118* (2013.01); *H05K 1/0298* (2013.01); *H05K 1/0393* (2013.01); *H05K 2201/0154* (2013.01)

(58) Field of Classification Search
CPC .... H05K 1/118; H05K 1/0298; H05K 1/0393; H05K 2201/0154; H05K 1/117; H05K 3/361; H05K 3/323; H05K 1/02; H05K 1/184
See application file for complete search history.

(56) References Cited

U.S. PATENT DOCUMENTS 4,357,750 A * 11/1982 Ostman ................ H05K 3/4092 439/502
5,844,783 A * 12/1998 Kojima ................ H05K 1/0219 361/826
6,384,339 B1 * 5/2002 Neuman ................ H05K 3/363 174/254
7,301,104 B2 * 11/2007 Miura .................... H05K 1/118 174/254

FOREIGN PATENT DOCUMENTS

JP 2011-222671 A 11/2011

* cited by examiner

*Primary Examiner* — Timothy J Thompson
(74) *Attorney, Agent, or Firm* — Studebaker Brackett PLLC

(57) ABSTRACT

Provided is a flexible printed board including: an insulating base material; a plurality of first wiring lines disposed on a front surface side of the base material; a plurality of first terminals each provided on an external connection side, of a respective one of the plurality of first wiring lines; a plurality of second wiring lines disposed on a rear surface side of the base material; and a plurality of second terminals each provided on an external connection side, of a respective one of the plurality of second wiring lines; in which: a restraining space for restraining surface flashover is provided from a first outermost terminal, which is outermost of the plurality of first terminals, through an edge portion of the base material, to a second outermost terminal, which is outermost of the plurality of second terminals.

6 Claims, 8 Drawing Sheets

10
41A1
21
40A
41A
20E
41A1
20
S1
S1
50A
30A
31A
Y1
X2
X1
Y2

50B
31B
30B
41B1
S1
S1
22
40B
41B
20E
20
41B1
Y2
X2
X1
Y1

10
B1
41A1
21
40A
41A
20E
41A1
20
S1
S1
51A
51A
50A
30A
31A
Y1
X2
X1
Y2

B1
50B
31B
30B
41B1
51B
51B
S1
S1
22
40B
41B
20E
20
41B1
Y2
X2
X1
Y1

FLEXIBLE PRINTED BOARD AND FLEXIBLE PRINTED BOARD CONNECTION STRUCTURE

CROSS-REFERENCE TO RELATED APPLICATION

This application claims priority from Japanese Patent Application No. 2022-190416 filed with the Japan Patent Office on Nov. 29, 2022, the entire content of which is hereby incorporated by reference.

BACKGROUND

1. Technical Field

The present disclosure relates to a flexible printed board and a flexible printed board connection structure.

2. Related Art

It is known that an anisotropic conductive film (ACF) as disclosed in JP-A-2011-222671, for example, is used as a connection structure for connecting a flexible printed board and another flexible printed board. In the configuration disclosed in JP-A-2011-222671, connection electrodes (9*a*, 10*a*) of a first flexible printed wiring board (5) and connection electrodes (15*a*, 16*a*) of a second flexible printed wiring board (11) are connected via a connection member (1) including an anisotropic conductive adhesive layer (4).

In such a connection, after the anisotropic conductive adhesive layer (4) of the connection members (1, 1) is superposed in a stretching manner on a region including the connection electrodes (9*a*, 10*a*, 15*a*, 16*a*), the first flexible printed wiring board (5) and the second flexible printed wiring board (11) sandwich the connection member (1) therebetween at a predetermined temperature and pressure. Thus, conductive particles are caught between connection wiring lines (3*a*) of the connection member (1) and the connection electrodes (9*a*, 10*a*, 15*a*, 16*a*), so that each connection wiring line and each connection electrode are caused to be electrically connected in the thickness direction. In addition, an anisotropic conductive adhesive constituting the anisotropic conductive adhesive layer (4) is caused to flow to fill the gap between the connection electrodes (9*a*, 10*a*, 15*a*, 16*a*), so that the connection members (1, 1) and the first and second flexible printed wiring boards (5, 11) are bonded.

SUMMARY

A flexible printed board according to an embodiment of the present disclosure includes: an insulating base material; a plurality of first wiring lines disposed on a front surface side of the base material; a plurality of first terminals each provided on an external connection side, of a respective one of the plurality of first wiring lines; a plurality of second wiring lines disposed on a rear surface side of the base material; and a plurality of second terminals each provided on an external connection side, of a respective one of the plurality of second wiring lines; in which: a restraining space for restraining surface flashover is provided from a first outermost terminal, which is outermost of the plurality of first terminals in an arrangement direction, through an edge portion of the base material, to a second outermost terminal, which is outermost of the plurality of second terminals in the arrangement direction, the surface flashover occurring between the first outermost terminal and the second outermost terminal.

DETAILED DESCRIPTION

Figures 1, 2:
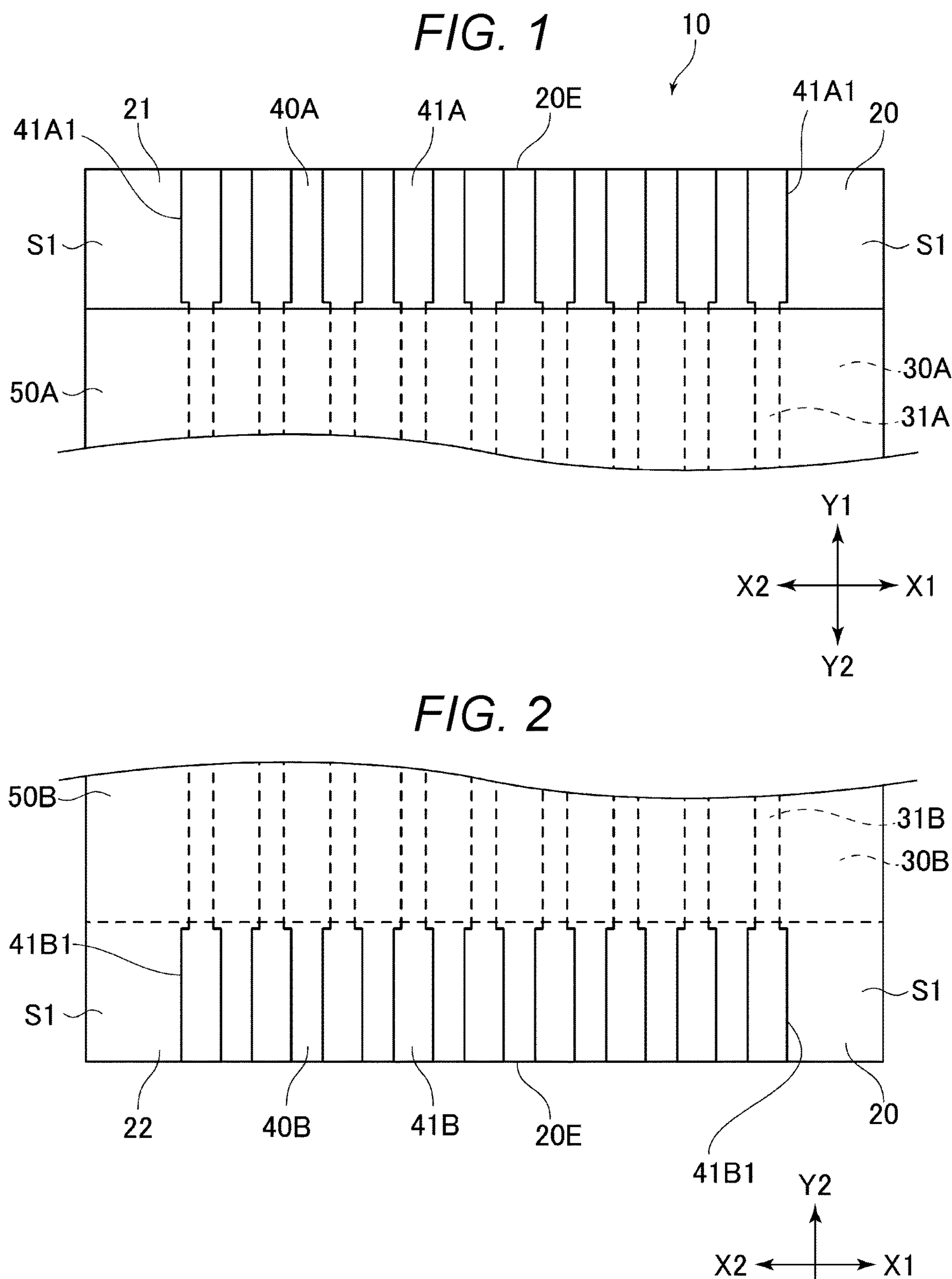
FIG. 1 is a plan view showing a configuration of a flexible printed board according to a first embodiment of the present disclosure.
FIG. 2 is a bottom view showing the configuration of the flexible printed board shown in FIG. 1.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In the configuration disclosed in JP-A-2011-222671, there is a concern that, on an end portion side of the connection electrodes (9*a*, 10*a*, 15*a*, 16*a*), an unintended discharge, i.e., a surface flashover may occur between a terminal arranged on the outermost side (end portion side) of the front surface and a terminal arranged on the outermost side (end portion side) of the rear surface. The surface flashover can be caused, for example, by excessive outflow of a conductive adhesive toward the end portion side.

In view of the above problems, an object of the present disclosure is to provide a flexible printed board and a flexible printed board connection structure capable of satisfactorily restraining surface flashover.

A flexible printed board according to one aspect of the present disclosure includes: an insulating base material; a plurality of first wiring lines disposed on a front surface side of the base material; a plurality of first terminals each provided on an external connection side, of a respective one of the plurality of first wiring lines; a plurality of second wiring lines disposed on a rear surface side of the base material; and a plurality of second terminals each provided on an external connection side, of a respective one of the plurality of second wiring lines; in which: a restraining space for restraining surface flashover is provided from a first outermost terminal, which is outermost of the plurality of first terminals in an arrangement direction, through an edge portion of the base material, to a second outermost terminal, which is outermost of the plurality of second terminals in the arrangement direction, the surface flashover occurring between the first outermost terminal and the second outermost terminal.

It is preferable in the flexible printed board that the restraining space is 2 mm or more.

It is preferable that the flexible printed board further includes: an insulating projecting portion, in which: the plurality of first wiring lines are at least partially covered with a first insulating layer; the plurality of second wiring lines are at least partially covered with a second insulating layer; and the insulating projecting portion is provided on at least one of an end portion side of the first insulating layer in the arrangement direction of the plurality of first terminals or an end portion side of the second insulating layer in the arrangement direction of the plurality of second terminals so as to project toward the external connection side.

It is preferable that the flexible printed board further includes: a first dummy terminal and a second dummy terminal, in which: the first dummy terminal is provided outside the first outermost terminal of the plurality of first terminals in the arrangement direction so as to extend toward the external connection side; and the second dummy terminal is provided outside the second outermost terminal of the plurality of second terminals in the arrangement direction so as to extend toward the external connection side.

It is preferable in the flexible printed board that the plurality of first terminals and the plurality of second terminals are provided in mirror symmetry with the base material interposed therebetween.

A flexible printed board connection structure according to one aspect of the present disclosure includes: the flexible printed board; and a connection member connected to the flexible printed board, in which: the connection member has an anisotropic conductive adhesive layer and a plurality of connection terminals; the anisotropic conductive adhesive layer includes an adhesive, and conductive particles; and the plurality of connection terminals are electrically connected to the plurality of first terminals or the plurality of second terminals via the conductive particles, and adjacent ones of the first terminals or adjacent ones of the second terminals are electrically insulated from each other via the adhesive.

According to the present disclosure, it is possible to provide a flexible printed board and a flexible printed board connection structure capable of satisfactorily restraining surface flashover.

First Embodiment

Figure 3:
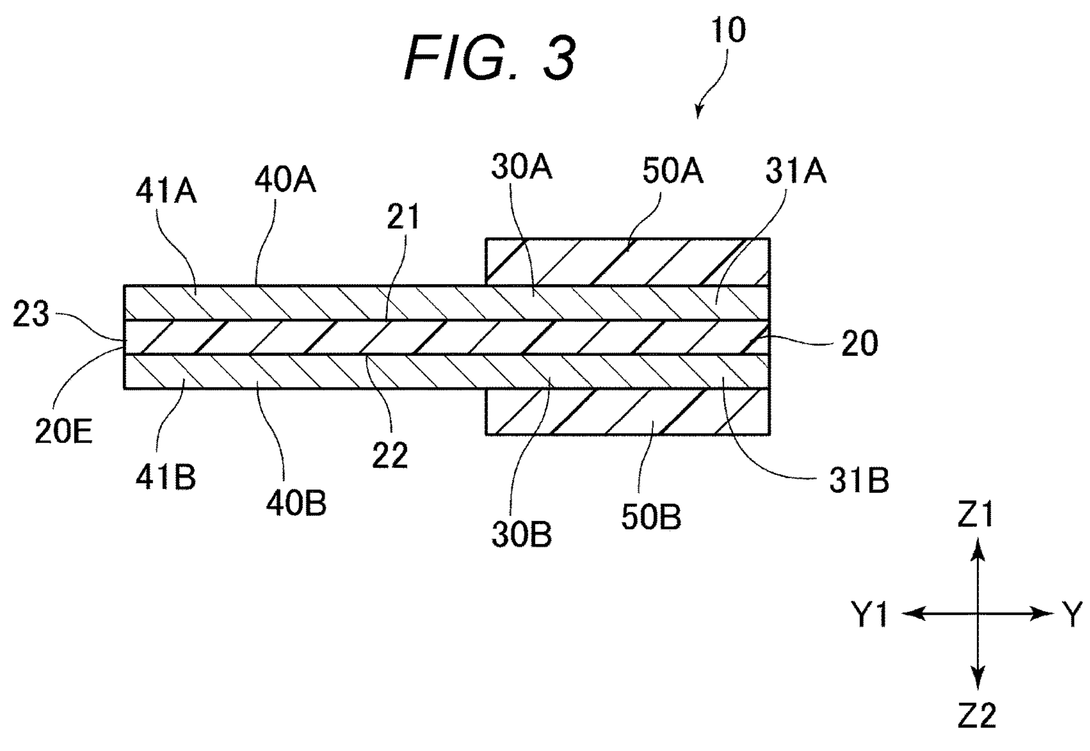
FIG. 3 is a cross-sectional view of the flexible printed board shown in FIG. 1.

Hereinafter, a flexible printed board 10 and a flexible printed board connection structure 11 according to a first embodiment of the present disclosure will be described with reference to the drawings. In the following description, the direction in which wire lines and terminals are arranged (arrangement direction) in FIG. 1 is referred to as an X direction, the right side of the paper surface of FIG. 1 is referred to as an X1 side, and the left side of the paper surface of FIG. 1 is referred to as an X2 side. Further, the direction in which the wire lines and the terminals are extended in FIG. 1 is referred to as a Y direction, the upper side of the paper surface of FIG. 1 is referred to as a Y1 side, and the lower side of the paper surface of FIG. 1 is referred to as a Y2 side. Further, the thickness direction of the flexible printed board 10 shown in FIG. 3 is referred to as a Z direction, the upper side in FIG. 3 is referred to as a Z1 side, and the lower side in FIG. 3 is referred to as a Z2 side. FIG. 1 is a plan view (top view) showing a configuration of the flexible printed board 10 according to the first embodiment of the present disclosure, and FIG. 2 is a bottom view showing the configuration of the flexible printed board 10 according to the first embodiment of the present disclosure. FIG. 3 is a cross-sectional view showing the configuration of the flexible printed board 10 according to the first embodiment of the present disclosure and showing a state cut in the Y direction along the wiring line and terminal.

<Regarding the Configuration of the Flexible Printed Board>

As shown in FIGS. 1 to 3, the flexible printed board 10 includes a base material 20, a first conductor layer 30A, a second conductor layer 30B, a first terminal portion 40A, a second terminal portion 40B, a first insulating layer 50A and a second insulating layer 50B as main components. A restraining space S1 exists between a first outermost terminal 41A1 of the first terminal portion 40A and a second outermost terminal 41B1 of the second terminal portion 40B. These configurations will be described below.

The base material 20 is, for example, a film-like member, and its material is an electrically insulating and flexible material such as polyimide or polyethylene terephthalate. The first conductor layer 30A is laminated on a front surface 21 of the base material 20, and the second conductor layer 30B is laminated on a rear surface 22 of the base material 20.

The first conductor layer 30A and the second conductor layer 30B are formed of a conductive material such as copper foil. A plurality of first wiring lines 31A and a plurality of second wiring lines 31B are respectively formed in the first conductor layer 30A and the second conductor layer 30B by, for example, performing a predetermined process using an ordinary photofabrication technique such as etching.

Figure 4:
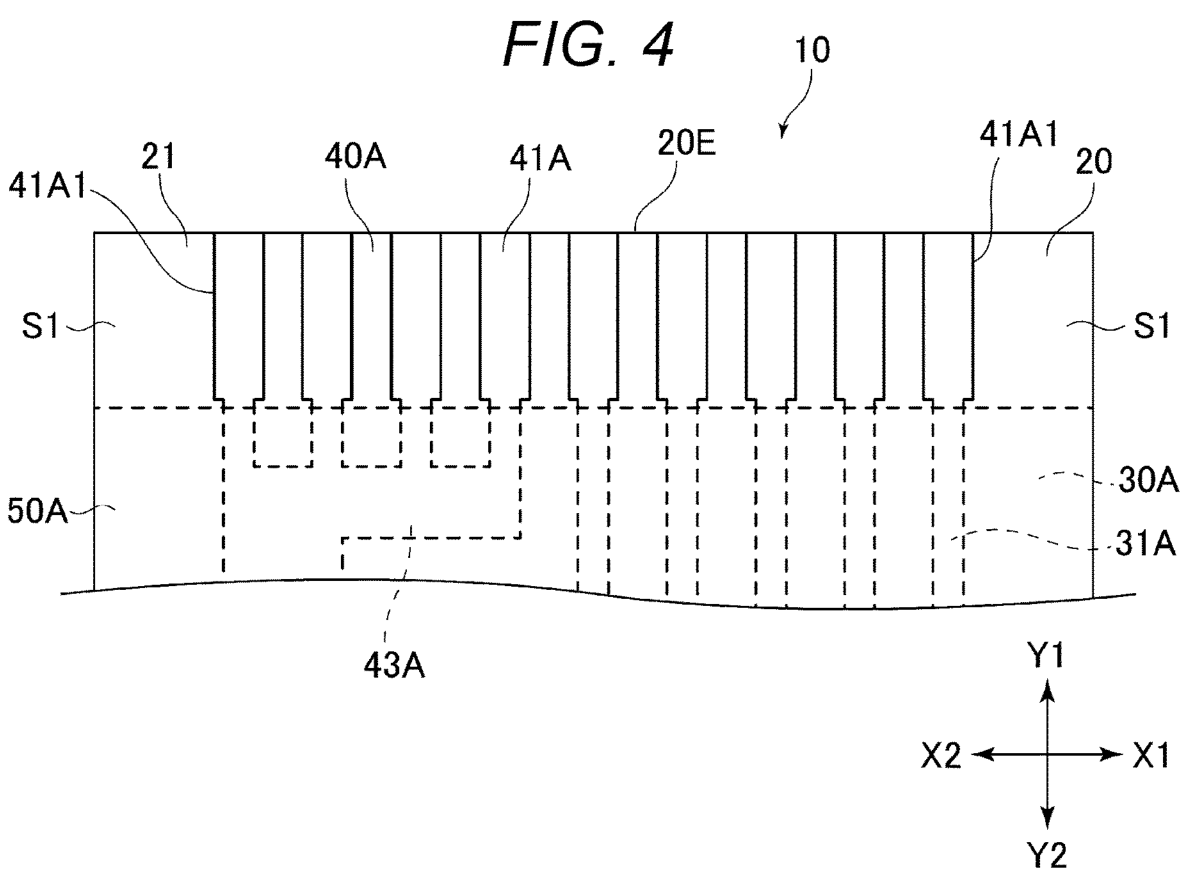
FIG. 4 is a plan view showing a configuration of the flexible printed board shown in FIG. 1 where at least one of a first wiring line or a second wiring line has a comb-like shape.

The first conductor layer 30A (the plurality of first wiring lines 31A) and the second conductor layer 30B (the plurality of second wiring lines 31B) may be provided so as to be in mirror symmetry with respect to the base material 20 interposed therebetween, or may not be in mirror symmetry. Further, as shown in FIG. 4, the plurality of wiring lines of at least one of the first conductor layer 30A or the second conductor layer 30B (at least one of the plurality of first wiring lines 31A or the plurality of second wiring lines 31B) that branches from one wiring line (the portion in the comb-like shape is hereinafter referred to as a comb-like terminal portion) may be provided in a comb-like shape. FIG. 4 shows a configuration in which a comb-like terminal portion 43A is provided on the front surface 21 side of the base material 20. However, it is obviously possible to employ a configuration in which the same comb-like terminal portion is provided on the rear surface 22 side of the base material 20.

The first terminal portion 40A is provided on a connection end portion 20E side (Y1 side in the present embodiment) on the front surface 21 side of the base material 20. Similarly, the second terminal portion 40B is provided on the connection end portion 20E side (Y1 side) on the rear surface 22 side of the base material 20. A plurality of first terminals 41A and a plurality of second terminals 41B are formed in the first terminal portion 40A and the second terminal portion 40B, respectively. Similar to the first conductor layer 30A and the second conductor layer 30B described above, the plurality of first terminals 41A and the plurality of second terminals 41B are formed by performing a predetermined process using an ordinary photofabrication technique such as etching.

In the example shown in FIGS. 1 to 3, each of the plurality of first terminals 41A is provided on the connection end portion 20E side of a respective one of the plurality of first wiring lines 31A. Each of the plurality of second terminals 41B is provided on the connection end portion 20E side of a respective one of the plurality of second wiring lines 31B. The connection end portion 20E side is a side to be connected to an external conductor, and can also be referred to as an external connection side.

In addition, in the examples shown in FIGS. 1 to 3, the line widths of the first terminal 41A and the second terminal 41B are wider than the line widths of the first wiring line 31A and the second wiring line 31B, respectively; however, the line widths are not limited to such a relationship.

Here, of the plurality of first terminals 41A, the outermost one in the arrangement direction (X direction) of the first terminals 41A is the first outermost terminal 41A1. Similarly, of the plurality of second terminals 41B, the outermost one in the arrangement direction (X direction) of the second terminals 41B is the second outermost terminal 41B1.

Figure 5:
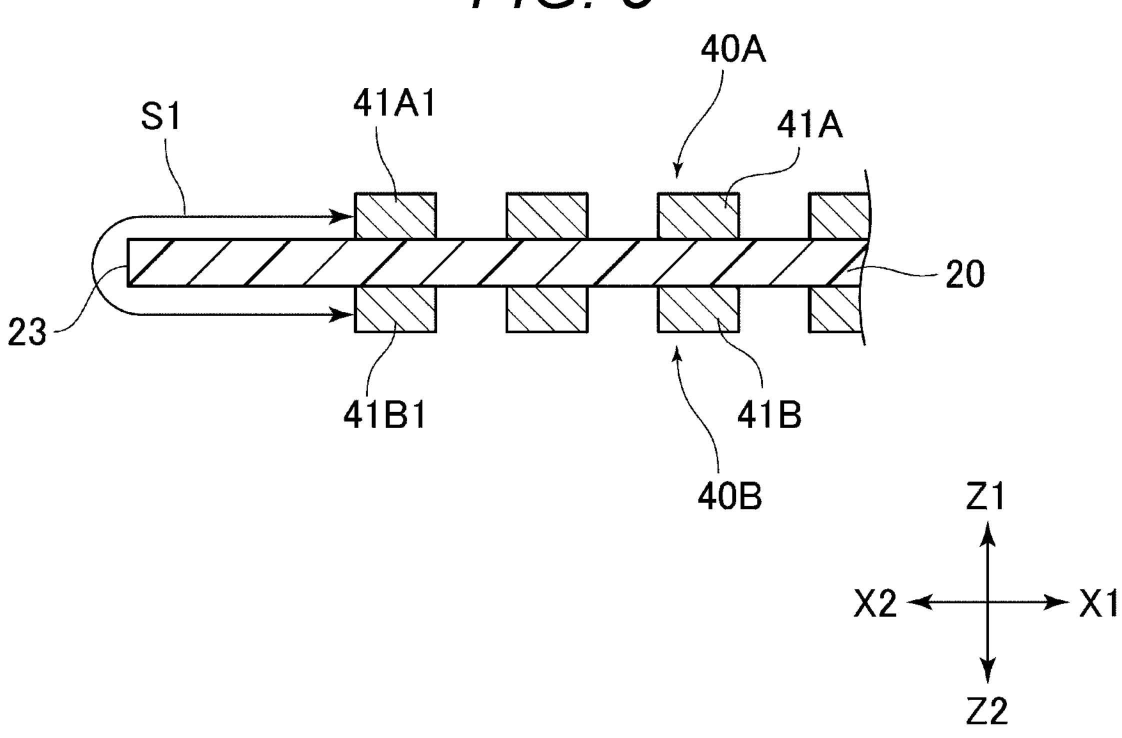
FIG. 5 is a diagram showing a state of the flexible printed board shown in FIG. 1 where a restraining space exists on an outer edge side of a base material.

The restraining space S1 exists between the first outermost terminal 41A1 and the second outermost terminal 41B1. Specifically, as shown in FIG. 5, the restraining space S1 exists from a side surface of the first outermost terminal 41A1 on the side where no adjacent first terminal 41A exists, through a side surface 23 (edge portion) of the base material 20, to a side surface of the second outermost terminal 41B1 on the side where no adjacent second terminal 41B exists.

The restraining space S1 is a space for restraining electrical short-circuiting due to discharge, so-called surface flashover, between the first outermost terminal 41A1 and the second outermost terminal 41B1. The larger a dimension of the restraining space S1, the more effectively the surface flashover can be restrained. However, if the restraining space S1 is made too large, the size of the flexible printed board 10 increases. Therefore, when a high voltage of about 100 to 300 V is applied to the first terminals 41A and the second terminals 41B, it is preferable that the restraining space S1 is about 2 mm, taking into account of slight outflow of an anisotropic conductive adhesive from an anisotropic conductive adhesive layer 130, which will be described later. However, the restraining space S1 can also be set to another size. Specifically, the restraining space S1 can be set in a range of 2 mm to 5 mm.

Further, as shown in FIGS. 1 to 4, at least part of the first conductor layer 30A (the plurality of first wiring lines 31A) (substantially the entire first conductor layer 30A in FIG. 1) is covered by the first insulating layer 50A. Similarly, at least part of the second conductor layer 30B (the plurality of second wiring lines 31B) (substantially the entire second conductor layer 30B in FIG. 2) is covered by the second insulating layer 50B. It is preferred that the first insulating layer 50A and the second insulating layer 50B are formed of an electrically insulating material, such as an epoxy-based adhesive material, which enters gaps between the first wiring lines 31A and gaps between the second wiring lines 31B. However, the first insulating layer 50A and the second insulating layer 50B may be formed of another material as long as it has electrical insulation properties.

Note that the first insulating layer 50A and the second insulating layer 50B may include a cover layer in addition to the above adhesive material. Examples of such a cover layer include film-like LCP (Liquid Crystal Polymer) and film-like polyimide.

<Regarding Connection Member 100>

Figure 6:
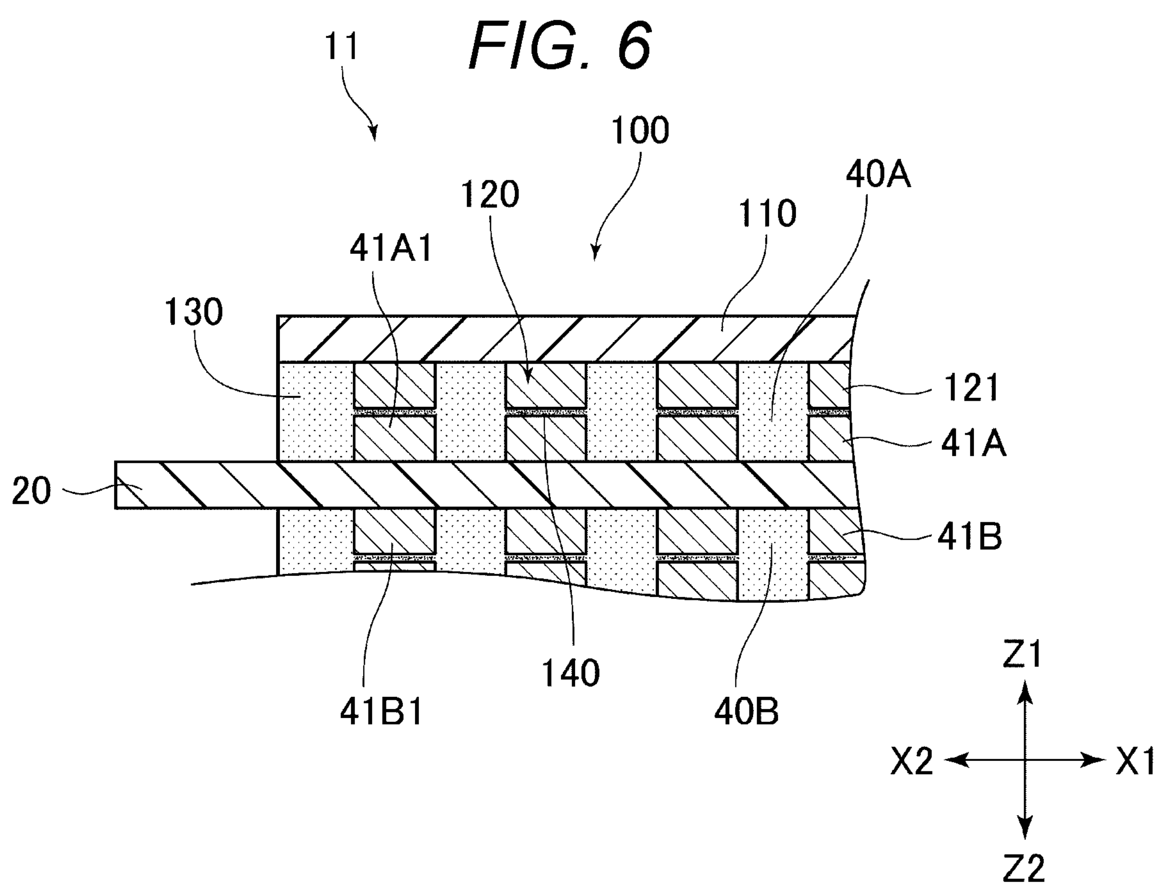
FIG. 6 is a cross-sectional view showing a configuration of a connection member to which the flexible printed board shown in FIG. 1 is connected.

Next, a connection member 100 will be described. FIG. 6 is a cross-sectional view showing a configuration of the connection member 100. As shown in FIG. 6, the connection member 100 includes a base material 110, a wiring layer 120, and an anisotropic conductive adhesive layer 130. Among these components, the base material 110 is, for example, a film-like member like the above-described base material 20, and its material is electrically insulating and flexible, such as polyimide or polyethylene terephthalate. Note that the base material 110 is not limited to being flexible, and may be a hard rigid board.

A plurality of connection terminals 121 is formed on the wiring layer 120. The plurality of connection terminals 121 is formed by performing a predetermined process using an ordinary photofabrication technique such as etching on a conductive material such as copper foil, similar to the case of the first conductor layer 30A and the second conductor layer 30B described above. The connection terminals 121 are electrically connected to the first terminals 41A or the second terminals 41B via conductive particles of the anisotropic conductive adhesive layer 130. Thus, the flexible printed board 10 can be electrically connected to terminals of an external electrical component via the connection member 100.

The anisotropic conductive adhesive layer 130 is formed by applying a paste-like anisotropic conductive adhesive to the base material 110 and the wiring layer 120 described above so as to have a predetermined thickness. The anisotropic conductive adhesive, which is the base of the anisotropic conductive adhesive layer 130, is obtained by dispersing and blending conductive particles in an adhesive component containing a thermosetting epoxy resin as a main agent. Microcapsules sealed with a curing agent may be dispersed and blended in the adhesive component containing the thermosetting epoxy resin as a main agent.

Here, when electrically connecting the first terminal portion 40A or the second terminal portion 40B to the connection member 100, the first terminal portion 40A or the second terminal portion 40B is covered by the anisotropic conductive adhesive layer 130. Thereafter, the connection member 100 (particularly the anisotropic conductive adhesive layer 130) is heated and pressurized at a predetermined temperature. Thus, the thermosetting epoxy resin is cured.

In the thermal curing, the conductive particles contained in the anisotropic conductive adhesive layer 130 are stretched between the first terminals 41A or the second terminals 41B and the connection terminals 121 so as to realize electrode connection portions 140 capable of conducting electricity. On the other hand, adjacent electrode connection portions 140 are separated from each other by an electrically insulating adhesive (the thermosetting epoxy resin in the present embodiment), which is the main agent of the anisotropic conductive adhesive layer 130, so as to be electrically insulated from each other.

Figure 7:
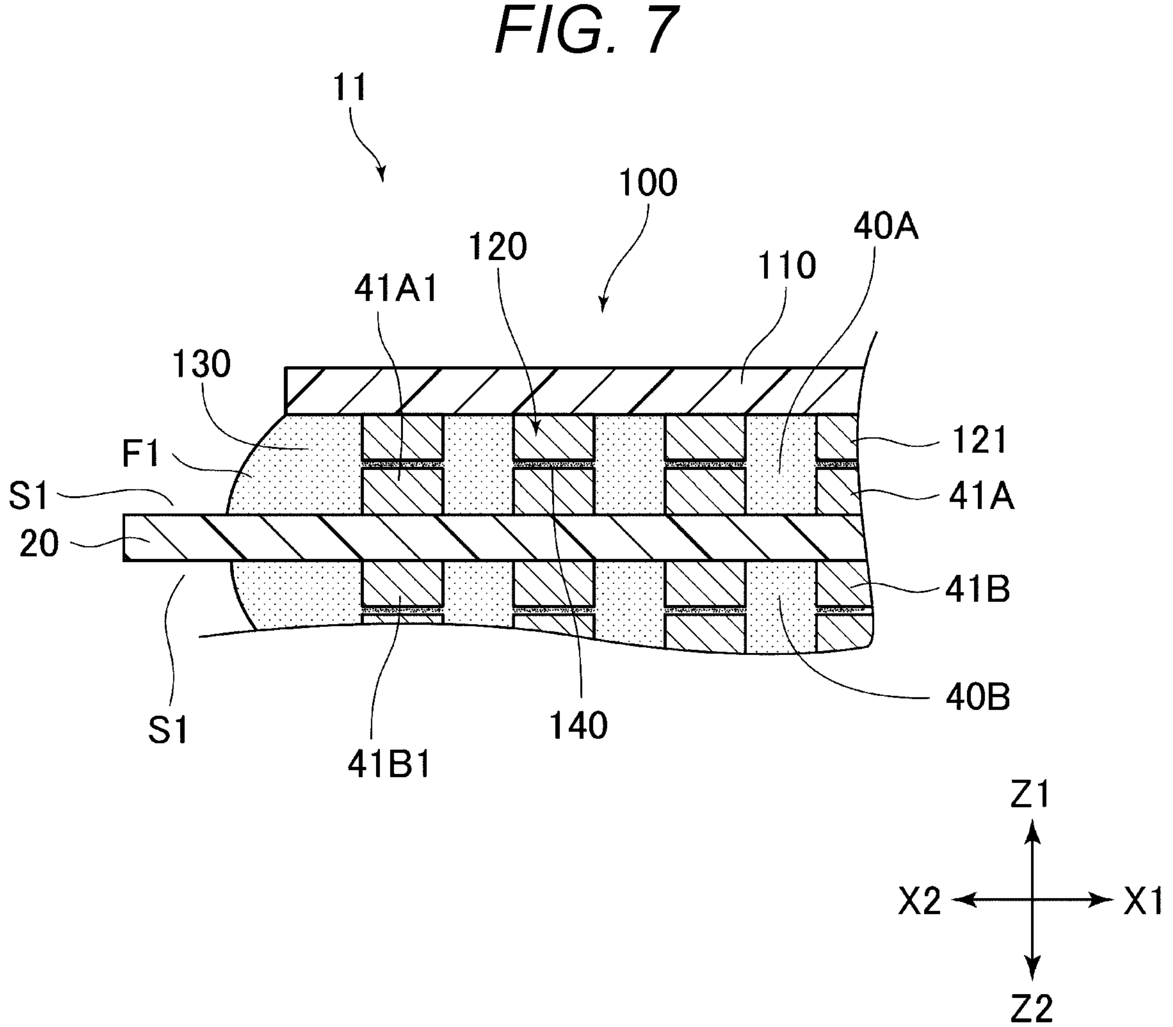
FIG. 7 is a view showing outflow of an anisotropic conductive adhesive of an anisotropic conductive adhesive layer in the connection member shown in FIG. 6.

When the electrode connection portions 140 are formed by heating and pressurizing the connection member 100 (particularly the anisotropic conductive adhesive layer 130) at a predetermined temperature, there is a concern that the anisotropic conductive adhesive may flow out to form an outflow portion F1. FIG. 7 is a view showing the outflow of the anisotropic conductive adhesive of the anisotropic conductive adhesive layer 130 in the connection member 100.

Here, in the present embodiment, the restraining space S1 is provided on the side surface 23 side of the base material 20. Therefore, even if the anisotropic conductive adhesive layer 130 flows out as shown in FIG. 7, it is possible to satisfactorily restrain surface flashover.

Second Embodiment

Figures 8, 9:
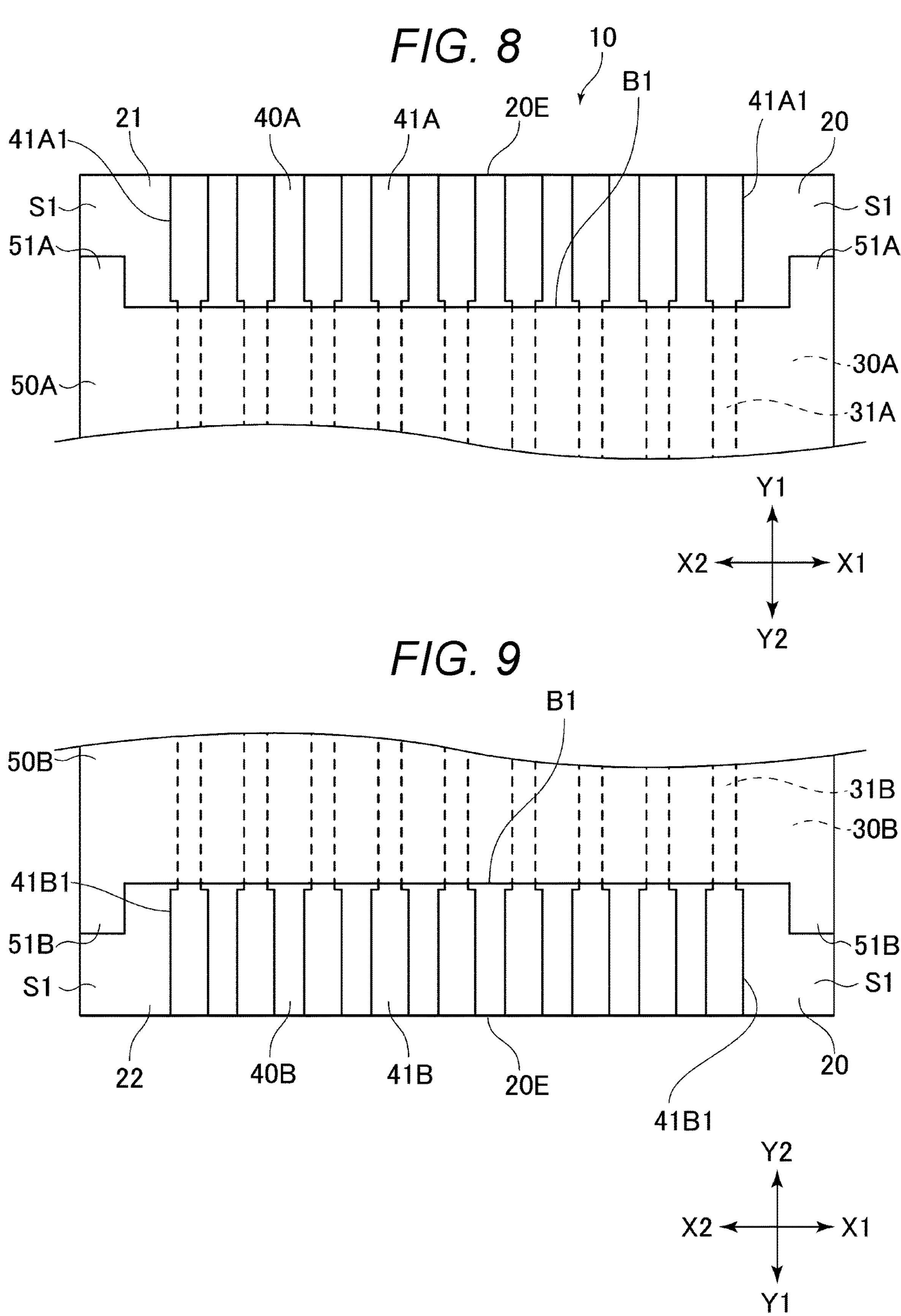
FIG. 8 is a plan view showing a flexible printed board according to a second embodiment of the present disclosure.
FIG. 9 is a bottom view showing the flexible printed board according to the second embodiment.
Figure 10:
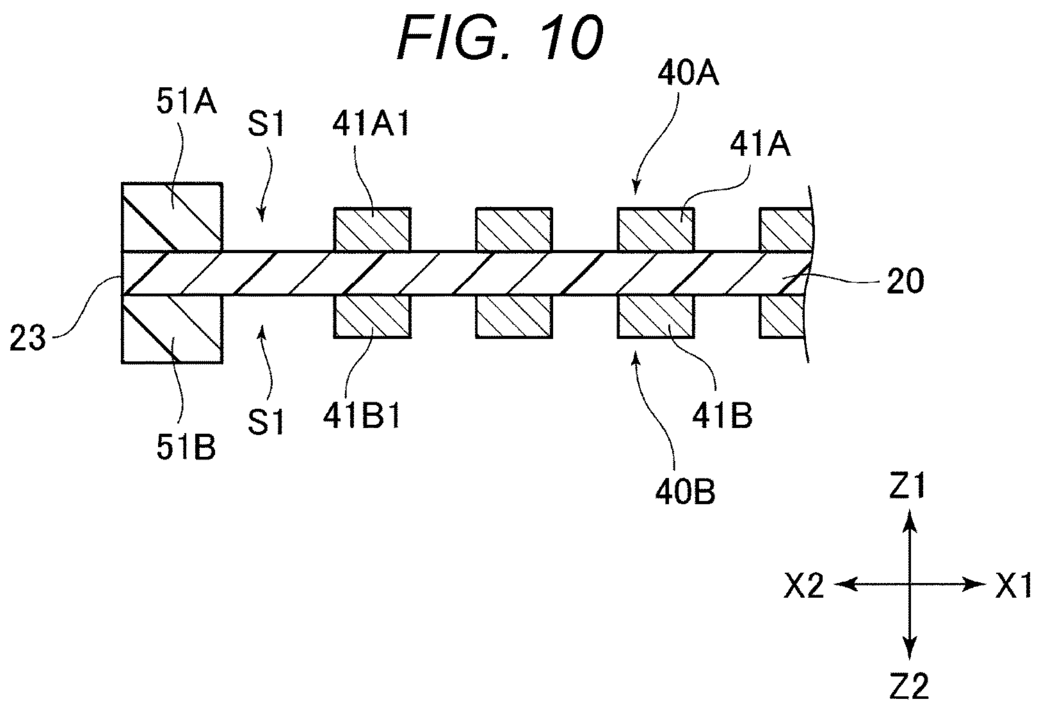
FIG. 10 is a cross-sectional view, taken along an arrangement direction, showing a first insulating projecting portion and a second insulating projecting portion in FIG. 8.

FIG. 8 is a plan view showing a flexible printed board 10 according to a second embodiment. FIG. 9 is a bottom view showing the flexible printed board 10 according to the second embodiment. FIG. 10 is a cross-sectional view, taken along the arrangement direction (X direction), showing a first insulating projecting portion 51A and a second insulating projecting portion 51B in FIG. 8. In the second embodiment, the components that are the same as in the first embodiment are denoted by the same reference numerals and the explanation thereof will be omitted as appropriate.

As shown in FIGS. 8 and 10, a first insulating layer 50A of the present embodiment has the first insulating projecting portion 51A. In the present embodiment, the first insulating projecting portion 51A is provided on the end portion side of the first insulating layer 50A in the arrangement direction (X direction) so as to project toward a connection end portion 20E side (Y1 side). Further, as shown in FIGS. 9 and 10, a second insulating layer 50B of the present embodiment has the second insulating projecting portion 51B. In the present embodiment, the second insulating projecting portion 51B is provided on the end portion side of a second insulating layer 50B in the arrangement direction (X direction) so as to project toward the connection end portion 20E side (Y1 side). Note that the first insulating projecting portion 51A and the second insulating projecting portion 51B may be referred to as insulating projecting portions.

When employing the configuration shown in FIGS. 8 to 10, surface flashover can be restrained more satisfactorily. In particular, since the anisotropic conductive adhesive layer 130 protrudes (escapes) in the Y1 direction when a connection member 100 is sandwiched at a predetermined temperature and pressure, the vicinity of a boundary B1 between a first terminal portion 40A and the first insulating layer 50A is an area where an anisotropic conductive adhesive layer 130 tends to flow out toward a side surface 23 side. Therefore, by providing the first insulating projecting portion 51A and the second insulating projecting portion 51B, the outflow of the anisotropic conductive adhesive layer 130 toward the side surface 23 side near the boundary B1 between the first terminal portion 40A and the first insulating layer 50A can be restrained, and thereby surface flashover can be restrained more satisfactorily.

It is preferable that the length of the first insulating projecting portion 51A and the second insulating projecting portion 51B in the Y1 direction (the length of the projecting portion) is set to, for example, about 1/10 to 1/3 of the length from the boundary B1 to the connection end portion 20E in the Y1 direction. However, the first insulating projecting portion 51A and the second insulating projecting portion 51B may be provided so as to further project from the vicinity of the boundary B1 toward the connection end portion 20E side (Y1 side). For example, the first insulating projecting portion 51A and the second insulating projecting portion 51B may be provided over the entire length from the boundary B1 to the connection end portion 20E in the Y1 direction, or be provided only over about 1/3 to 2/3 of the length in the Y1 direction.

Third Embodiment

Figure 11:
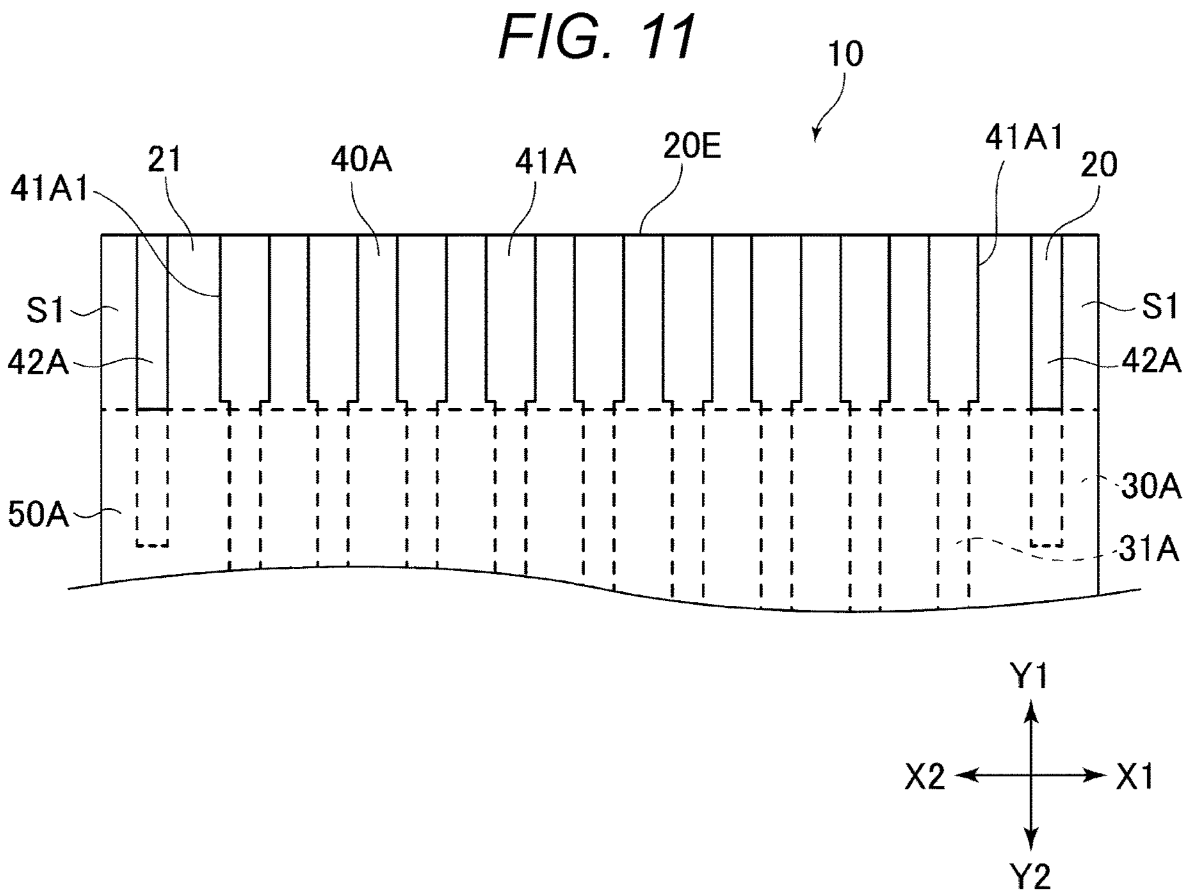
FIG. 11 is a plan view showing a flexible printed board according to a third embodiment.
Figure 12:
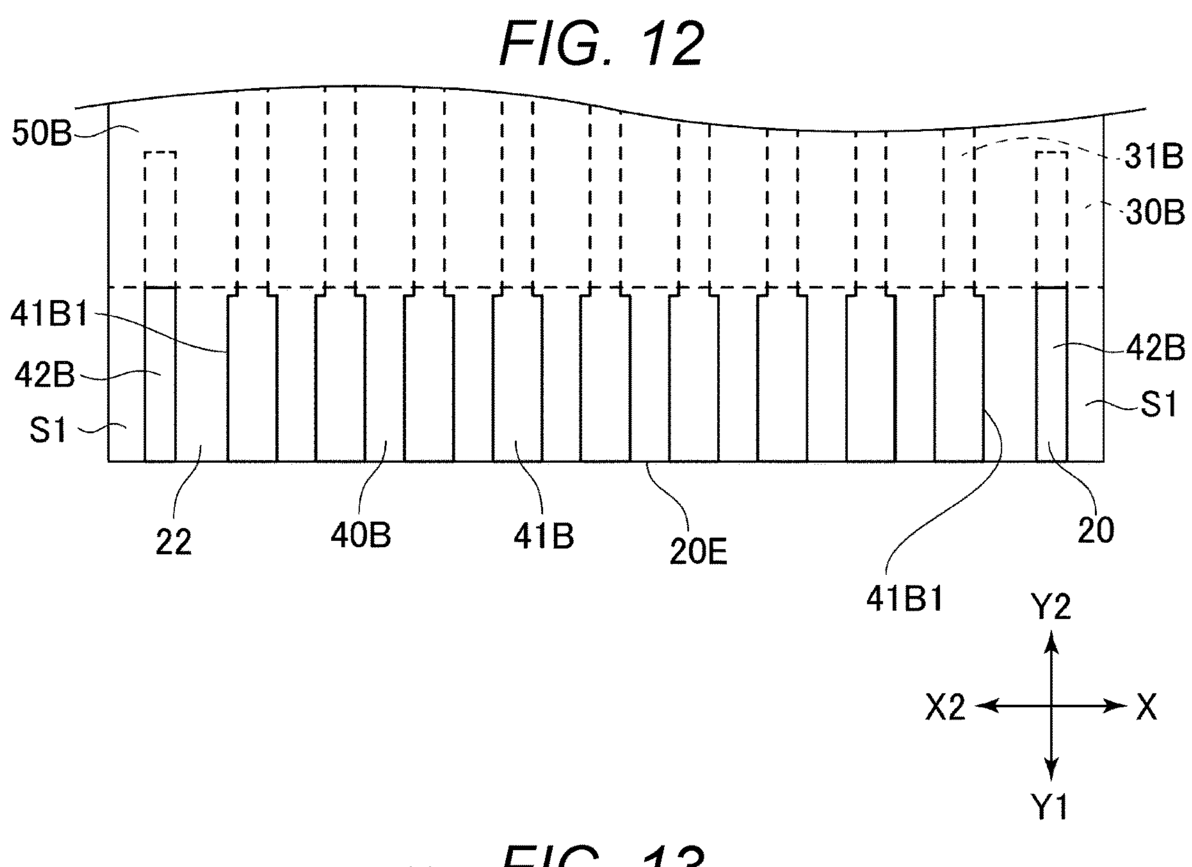
FIG. 12 is a bottom view showing the flexible printed board according to the third embodiment.
Figure 13:
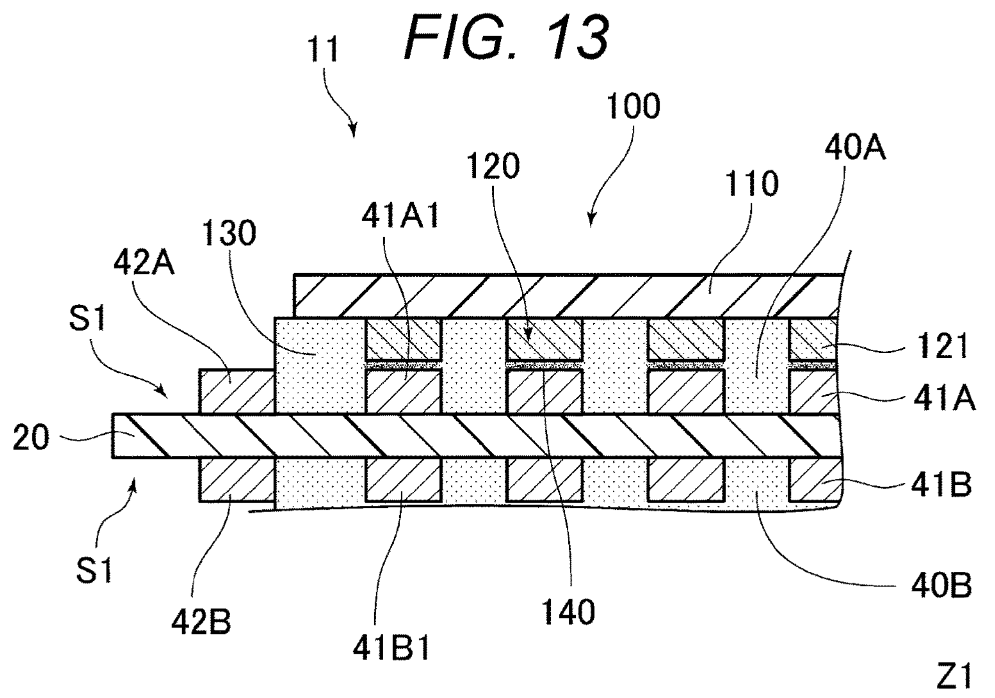
FIG. 13 is a cross-sectional view, taken along the arrangement direction, showing a first dummy terminal and a second dummy terminal in a flexible printed board connection structure using the flexible printed board according to the third embodiment.
Figure 13:
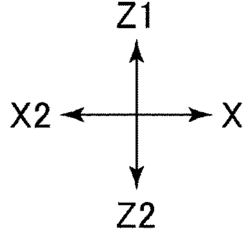

FIG. 11 is a plan view showing a flexible printed board 10 according to a third embodiment. FIG. 12 is a bottom view showing the flexible printed board 10 according to the third embodiment. FIG. 13 is a cross-sectional view, taken along the arrangement direction (X direction), showing a first dummy terminal 42A and a second dummy terminal 42B in a flexible printed board connection structure 11 using the flexible printed board 10 according to the third embodiment. In the third embodiment, the components that are the same as in the first embodiment are denoted by the same reference numerals and the explanation thereof will be omitted as appropriate.

As shown in FIGS. 11 and 13, a first terminal portion 40A is provided with the first dummy terminal 42A outside a first outermost terminal 41A1 of a first terminal 41A. The first dummy terminal 42A is provided so as to extend toward a connection end portion 20E (Y1 side). Further, as shown in FIGS. 12 and 13, a second terminal portion 40B is provided with the second dummy terminal 42B outside a second outermost terminal 41B1 of a second terminal 41B. The second dummy terminal 42B is provided so as to extend toward the connection end portion 20E. The first dummy terminal 42A and the second dummy terminal 42B are not electrically connected to first wiring lines 31A and second wiring lines 31B.

The first dummy terminal 42A and the second dummy terminal 42B are isolated patterns that are not electrically connected to another conductor. The first dummy terminal 42A and the second dummy terminal 42B serve as something like a breakwater to restrain the outflow of an anisotropic conductive adhesive layer 130 toward a side surface 23 side. Therefore, surface flashover can be restrained more satisfactorily.

(Effect)

The flexible printed board 10 and the flexible printed board connection structure 11 of the present disclosure having the above configurations include: the base material 20 formed of a material having electrical insulation; the first conductor layer 30A disposed on the front surface 21 side of the base material 20 and having the plurality of first wiring lines 31A; the first terminal portion 40A disposed on the connection end portion 20E side of the first conductor layer 30A and provided with the plurality of first terminals 41A for electrically connecting the first wiring lines 31A of the first conductor layer 30A with an external conductor; the second conductor layer 30B disposed on the rear surface 22 side of the base material 20 and provided with the plurality of second wiring lines 31B; and the second terminal portion 40B disposed on the connection end portion 20E side of the second conductor layer 30B and provided with the plurality of second terminals 41B for electrically connecting the second wiring lines 31B of the second conductor layer 30B with an external conductor. In such a configuration, the restraining space S1 for restraining surface flashover exists from the first outermost terminal 41A1, which is the outermost first terminal 41A of the first terminal portions 40A in the arrangement direction (X direction), through the edge portion of the base material 20, to the second outermost terminal 41B1, which is the outermost second terminal 41B of the second terminal portion 40B in the arrangement direction.

Thus, the flexible printed board 10 is provided with the restraining space S1. Therefore, for example, even if the anisotropic conductive adhesive layer 130 flows out toward the end portion side of the base material 20, surface flashover can be restrained by the restraining space S1.

In the flexible printed board 10 of the present disclosure, the restraining space S1 is preferably set to 2 mm or more. With such a configuration, surface flashover can be restrained more satisfactorily.

In the flexible printed board 10 of the present disclosure, at least a part of the first conductor layer 30A is covered by the first insulating layer 50A, and the first insulating projecting portion 51A (insulating projecting portion) projecting toward the connection end portion 20E side is provided on the end portion side of the first insulating layer 50A in the arrangement direction (X direction). Also, at least a part of the second conductor layer 30B is covered by the second insulating layer 50B, and the second insulating projecting portion 51B (insulating projecting portion) projecting toward the connection end portion 20E side is provided on the end portion side of the second insulating layer 50B in the arrangement direction (X direction).

In such a manner, by providing the first insulating projecting portion 51A (insulating projecting portion) and the second insulating projecting portion 51B (insulating projecting portion), the outflow of the anisotropic conductive adhesive layer 130 toward the side surface 23 side can be restrained in the vicinity of the boundary B1 between the first terminal portion 40A and the first insulating layer 50A. Therefore, surface flashover in the flexible printed board 10 can be restrained more satisfactorily.

Further, in the flexible printed board 10 of the present disclosure, the first terminal portion 40A is provided with the first dummy terminal 42A outside the first outermost terminal 41A1 so as to extend toward the connection end portion 20E, the first dummy terminal 42A being not electrically connected to an external conductor and the first wiring lines 31A. Also, the second terminal portion 40B is provided with the second dummy terminal 42B outside the second outermost terminal 41B1 so as to extend toward the connection end portion 20E, the second dummy terminal 42B being not electrically connected to an external conductor and the second wiring lines 31B.

With such a configuration, even if the anisotropic conductive adhesive layer 130 flows out toward the side surface 23 side, the outflow of the anisotropic conductive adhesive layer 130 toward the side surface 23 side can be stopped by the first dummy terminal 42A and the second dummy terminal 42B. That is, the first dummy terminal 42A and the second dummy terminal 42B can function as something like a breakwater that restrain the outflow of the anisotropic conductive adhesive layer 130. Therefore, surface flashover can be restrained more satisfactorily.

Further, in the flexible printed board 10 of the present disclosure, the first terminal portion 40A and the second terminal portion 40B are provided in mirror symmetry with the base material 20 interposed therebetween. Therefore, it becomes easier to establish an electrical connection between the connection terminals 121 of the wiring layer 120 of the connection member 100 and the first terminals 41A or the second terminals 41B, thereby facilitating the manufacture of the flexible printed board connection structure 11.

Further, the connection structure 11 of the flexible printed board 10 of the present disclosure includes: the above-described flexible printed board 10; the anisotropic conductive adhesive layer 130 including an adhesive as a main material, and a large number of conductive particles dispersed in the adhesive; and the connection member 100 including the wiring layer 120 having a plurality of connection terminals 121, in which the connection member 100 is electrically connected to the first terminals 41A or the second terminals 41B via the conductive particles. At the same time, electrical insulation is ensured between adjacent first terminals 41A or between adjacent second terminals 41B.

The flexible printed board connection structure 11 formed by using the flexible printed board 10 and the connection member 100 is provided with the restraining space S1. Therefore, for example, even if the anisotropic conductive adhesive layer 130 flows out toward the end portion side of the base material 20, surface flashover can be restrained by the restraining space S1.

(Modifications)

The embodiments of the present disclosure have been described above; however, the present disclosure can be variously modified. Modifications will be described below.

The second embodiment describes a configuration in which the first insulating layer 50A is provided with the first insulating projecting portion 51A (insulating projecting portion) that projects toward the connection end portion 20E side, and the second insulating layer 50B is provided with the second insulating projecting portion 51B (insulating projecting portion) that projects toward the connection end portion 20E side. However, a configuration in which the insulating projecting portion is provided only on one of the first insulating layer 50A and the second insulating layer 50B may be employed. That is, the second insulating projecting portion 51B may be provided only on the second insulating layer 50B instead of providing the first insulating projecting portion 51A on the first insulating layer 50A. On the contrary, the first insulating projecting portion 51A may be provided only on the first insulating layer 50A instead of providing the second insulating projecting portion 51B on the second insulating layer 50B.

Further, in the second embodiment described above, the first insulating layer 50A is provided with the first insulating projecting portion 51A, and the second insulating layer 50B is provided with the second insulating projecting portion 51B; therefore, the outflow of the anisotropic conductive adhesive layer 130 toward the side surface 23 side in the vicinity of the boundary B1 between the first terminal portion 40A and the first insulating layer 50A is restrained. However, instead of such a configuration, a configuration as shown in FIG. 14 may be employed.

Figure 14:
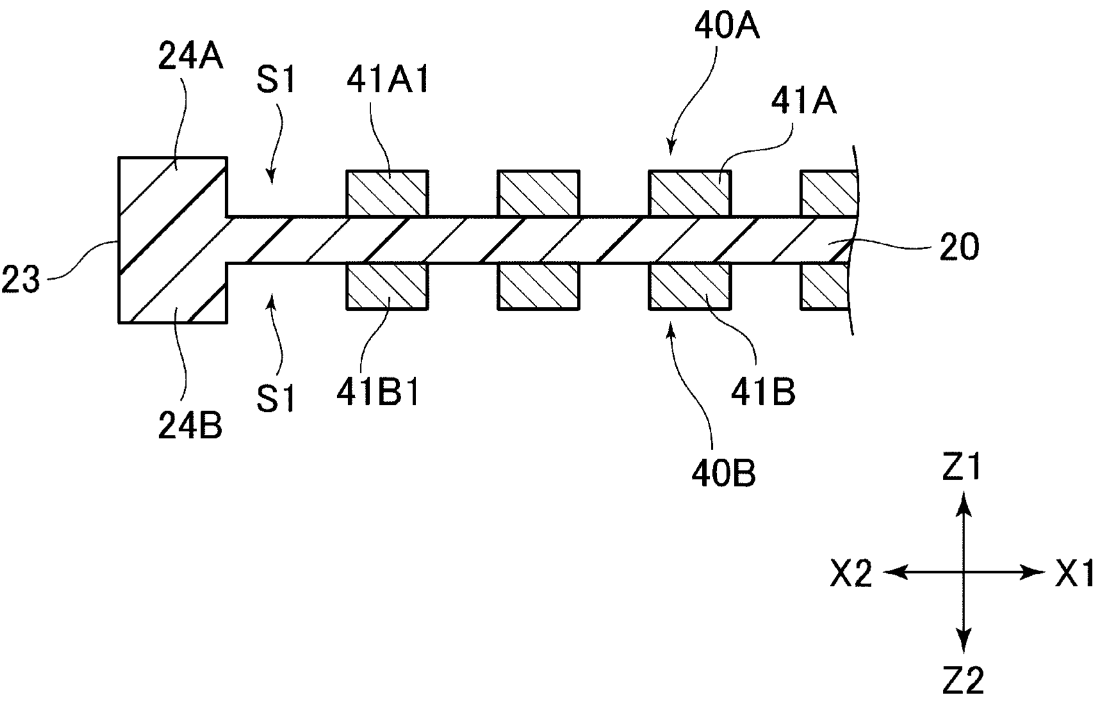
FIG. 14 is a cross-sectional view of a flexible printed board according to a modification of the second embodiment of the present disclosure.

FIG. 14 shows a modification of the second embodiment. In the configuration shown in FIG. 14, a first base material projecting portion 24A projecting toward a connection end portion 20E side is provided on an end portion side of a front surface 21 of a base material 20 in the arrangement direction (X direction). Further, a second base material projecting portion 24B projecting toward the connection end portion 20E side is provided on an end portion side of a rear surface 22 of the base material 20 in the arrangement direction (X direction).

Even with such a configuration, the outflow of an anisotropic conductive adhesive layer 130 toward a side surface 23 side of the base material 20 can be restrained by the first base material projecting portion 24A or the second base material projecting portion 24B. Therefore, surface flashover in the flexible printed board 10 can be restrained more satisfactorily.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A flexible printed board comprising:

an insulating base material;

a plurality of first wiring lines disposed on a front surface side of the insulating base material, the plurality of first wiring lines being arranged in a length direction of the insulating base material and the plurality of first wiring lines extending in a width direction of the insulating base material;

a plurality of first terminals disposed on the front surface side, each of the plurality of first terminals provided on an external connection side, of a respective one of the plurality of first wiring lines;

a plurality of second wiring lines disposed on a rear surface side of the insulating base material, the plurality of second wiring lines being arranged in the length direction of the insulating base material and the plurality of second wiring lines extending in the width direction of the insulating base material;

a plurality of second terminals disposed on the rear surface side, each of the plurality of second terminals provided on an external connection side, of a respective one of the plurality of second wiring lines; and a connection member including a conductive adhesive layer and a plurality of connection terminals electrically connected to the plurality of first terminals and the plurality of second terminals via the conductive adhesive layer, wherein the insulating base material includes a restraining space at each end of the insulating base material in the width direction of the insulating base material, which is outside of a first outermost terminal among the plurality of first terminals in the length direction and outside of a second outermost terminal among the plurality of second terminals length direction, the restraining space configured to restrain surface flashover of electrical discharge occurring between the first outermost terminal via a first outflow portion of the conductive adhesive layer between the connection member and the first outermost terminal and the second outermost terminal via a second outflow portion of the conductive adhesive layer between the connection member and the second outermost terminal around a side surface of an edge of the insulating base material.

2. The flexible printed board according to claim 1, wherein the restraining space is 2 mm or more in the width direction of the insulating base material.

3. The flexible printed board according to claim 1, further comprising:

an insulating projecting portion, wherein the plurality of first wiring lines are at least partially covered with a first insulating layer, the plurality of second wiring lines are at least partially covered with a second insulating layer, and the insulating projecting portion is provided on at least one of an end portion side of the first insulating layer in the length direction of the plurality of first terminals or an end portion side of the second insulating layer in the length direction of the plurality of second terminals so as to project toward the external connection side.

4. The flexible printed board according to claim 1 further comprising:

a first dummy terminal and a second dummy terminal, wherein the first dummy terminal is provided outside the first outermost terminal of the plurality of first terminals in the length direction so as to extend toward the external connection side, and the second dummy terminal is provided outside the second outermost terminal of the plurality of second terminals in the length direction so as to extend toward the external connection side.

5. The flexible printed board according to claim 1, wherein the plurality of first terminals and the plurality of second terminals are provided in mirror symmetry with the insulating base material interposed therebetween.

6. The flexible printed board according to claim 1, wherein the conductive adhesive layer includes an anisotropic conductive adhesive layer, the anisotropic conductive adhesive layer includes an adhesive and conductive particles, and the plurality of connection terminals are electrically connected to the plurality of first terminals or the plurality of second terminals via the conductive particles, and adjacent ones of the plurality of first terminals or adjacent ones of the plurality of second terminals are electrically insulated from each other via the adhesive.

* * * * *